(12) United States Patent
Chen et al.

(10) Patent No.: US 7,704,306 B2
(45) Date of Patent: Apr. 27, 2010

(54) MANUFACTURE OF ELECTROLESS COBALT DEPOSITION COMPOSITIONS FOR MICROELECTRONICS APPLICATIONS

(75) Inventors: Qingyun Chen, Branford, CT (US); Richard Hurtubise, Clinton, CT (US); Vincent Paneccasio, Madison, CT (US); Charles Valverde, Ansonia, CT (US); Daniel Stritch, West Haven, CT (US)

(73) Assignee: Enthone Inc., West Haven, CT (US)

( * ) Notice: Subject to any disclaimer, the term of this patent is extended or adjusted under 35 U.S.C. 154(b) by 678 days.

(21) Appl. No.: 11/549,775

(22) Filed: Oct. 16, 2006

(65) Prior Publication Data
US 2008/0090414 A1 Apr. 17, 2008

(51) Int. Cl.
*C23C 18/34* (2006.01)
*C23C 18/36* (2006.01)
(52) U.S. Cl. ..................... 106/1.22; 106/1.27
(58) Field of Classification Search ............... 106/1.22, 106/1.27
See application file for complete search history.

(56) References Cited

U.S. PATENT DOCUMENTS

| | | | | |
|---|---|---|---|---|
| 6,815,357 | B2 * | 11/2004 | Homma et al. | 438/695 |
| 7,332,193 | B2 * | 2/2008 | Valverde et al. | 427/99.5 |
| 7,410,899 | B2 * | 8/2008 | Chen et al. | 438/678 |
| 2003/0207560 | A1 | 11/2003 | Dubin et al. | |
| 2004/0134375 | A1 | 7/2004 | Kolics et al. | |
| 2004/0222100 | A1 | 11/2004 | Basol | |
| 2004/0245214 | A1 | 12/2004 | Katakabe et al. | |
| 2004/0253814 | A1 | 12/2004 | Cheng et al. | |
| 2005/0008786 | A1 | 1/2005 | Dubin et al. | |
| 2005/0009340 | A1 | 1/2005 | Saijo et al. | |
| 2005/0072525 | A1 | 4/2005 | Pancham et al. | |
| 2005/0084615 | A1 | 4/2005 | Weidman et al. | |
| 2005/0095830 | A1 * | 5/2005 | Weidman et al. | 438/584 |
| 2005/0136193 | A1 | 6/2005 | Weidman et al. | |
| 2005/0161338 | A1 | 7/2005 | Fang et al. | |
| 2005/0275100 | A1 | 12/2005 | Yakobson et al. | |
| 2006/0029727 | A1 | 2/2006 | Ivanov | |

OTHER PUBLICATIONS

International Search Report, PCT/US07/78555, dated Jan. 29, 2008, 2 pages.
Written Opinion of the International Searching Authority, PCT/US07/78555, dated Jan. 29, 2008, 5 pages.
International Preliminary Report on Patentability, PCT/US2007/078555, dated Apr. 22, 2009, 6 pages.

* cited by examiner

*Primary Examiner*—Helene Klemanski
(74) *Attorney, Agent, or Firm*—Senniger Powers LLP

(57) ABSTRACT

A method of preparing an aqueous electroless deposition composition for electrolessly depositing Co or a Co alloy onto a substrate in manufacture of microelectronic devices by treating water or an aqueous electroless deposition composition with a deoxygenating treatment to reduce the oxygen concentration.

22 Claims, 8 Drawing Sheets

MANUFACTURE OF ELECTROLESS COBALT DEPOSITION COMPOSITIONS FOR MICROELECTRONICS APPLICATIONS

FIELD OF THE INVENTION

This invention relates to electroless plating of Co and Co alloys in various plating industries, especially microelectronic device applications. More specifically, this invention relates to process control of solution manufacturing to yield an electroless Co plating composition exhibiting improved plating performance.

BACKGROUND OF THE INVENTION

Electroless deposition of Co is performed in a variety of applications in the manufacture of microelectronic devices. For example, Co is used in capping of damascene Cu metallization employed to form electrical interconnects in integrated circuit substrates. Copper can diffuse rapidly into a Si substrate and dielectric films such as, for example, $SiO_2$ or low k dielectrics. Copper can also diffuse into a device layer built on top of a substrate in multilayer device applications. Such diffusion can be detrimental to the device because it can cause electrical leakage in substrates, or form an unintended electrical connection between two interconnects resulting in an electrical short. Moreover, Cu diffusion out of an interconnect feature can disrupt electrical flow. Copper also has a tendency to migrate from one location to another when electrical current passes through interconnect features in service, creating voids and hillocks. This migration can damage an adjacent interconnect line and disrupt electrical flow in the feature where the metal migrates.

Accordingly, among the challenges facing integrated circuit device manufacturers is to minimize diffusion and electromigration of metal in metal-filled interconnect features. This challenge becomes more acute as the devices further miniaturize, and as the features further miniaturize and densify. Cobalt capping is employed to inhibit this Cu diffusion and migration.

Another challenge in the context of metal interconnect features is to protect them from corrosion. Certain interconnect metals, especially Cu, are more susceptible to corrosion. Copper is a fairly reactive metal which readily oxidizes under ambient conditions. This reactivity can undermine adhesion to dielectrics and thin films, resulting in voids and delamination. Another challenge is therefore to combat oxidation and enhance adhesion between the cap and the Cu, and between structure layers.

The industry has deposited Co-based caps over Cu and other metal interconnect features in response to these challenges, as discussed in, for example, U.S. Pat. Pub. Nos. 2003/0207560 and 2005/0275100.

A particular Co-based metal capping layer employed to reduce Cu migration, provide corrosion protection, and enhance adhesion between the dielectric and Cu is a ternary alloy including Co, W, and P. Another refractory metal may replace or be used in addition to W, and B is often substituted for or used in addition to P. Each component of the ternary alloy imparts advantages to the protective layer.

A particular problem for the integration of this technology to current ULSI fabrication lines is capping layer defectivity. In recent years, the defectivity has been an object in inventions relating to plating baths and tools. See Katakabe et al. (U.S. Pat. Pub. No. 2004/0245214), Kolics et al. (U.S. Pat. Pub. No. 2004/0134375), Dubin et al. (U.S. Pat. Pub. No. 2005/0008786), Cheng et al. (U.S. Pat. Pub. No. 2004/0253814), Weidman et al. (U.S. Pat. Pub. No. 2005/0084615), Pancham et al. (U.S. Pat. Pub. No. 2005/0072525), and Saijo et al. (U.S. Pat. Pub. No. 2005/0009340). Defectivity reduction remains a challenge in ULSI fabrication lines.

Typical defects in electroless plated cobalt alloys for use as caps on interconnect features may be summarized as follows.

Nodulation: localized preferential growth or particle formation on the Cu deposit, at Cu/dielectric and Cu/barrier interfaces, and on dielectric surfaces. This problem may be partially caused by a lack of stability of the working bath, metal impurities in the solutions, etc. The existence of $Co^{3+}$ due to the oxidation of $Co^{2+}$ by dissolved oxygen are thought to corrode the copper surface prior to initiation by oxidizing copper to $Cu^{2+}$. The $Cu^{2+}$ ions can be easily reduced by DMAB or other reducing agents present in the bath and form Cu particles which are available as nuclei for growth of cobalt particles.

"Grain decoration": uneven morphology of electroless Co film along the Cu line that replicates Cu erosion before plating and/or unevenly grown Co film due to initiation delay at Cu grain interfaces. Such growth can contribute to overall deposit roughness. The existence of dissolved oxygen and $Co^{3+}$ ions can cause initiation delay of electroless cobalt plating, resulting in the excessive copper corrosion on small crystalline and grain boundaries prior to deposition, thus changing the surface topography.

Granularity: irregularly sized nanocrystallites and clusters of amorphous electroless deposits of Co and its alloys with large grains and well-defined grain interfaces. This type of morphology can contribute to surface roughness.

Non-uniform growth: varying deposit thickness along the Cu substrate due to different initiation time and/or plating rate of electroless Co on different size features, features located in different areas, dense and isolated, and/or features with different surface areas. The presence of trace levels of dissolved oxygen and $Co^{3+}$ ions in the plating bath affect the initiation and plating rate differently on different features due to diffusion limitation effects, resulting in non-uniform growth of cobalt alloy deposits.

Pitting: the formation of pits or pinholes due to localized incomplete Cu surface coverage or extensive hydrogen bubble formation during the deposition process of the electroless film.

Those defects decrease diffusion barrier effectiveness, lower the capability of the capping layer to suppress electromigration, cause electromigration failure, affect the signal propagation across the circuitry, increase current leakage, result in electrical shorts, and are the major limitation for this technology to be adopted in the 45 nm node or beyong.

Therefore, a need continues to exist for substantially defect free, uniform, and smooth electrolessly deposited capping layers over Cu interconnects.

SUMMARY OF THE INVENTION

Among the various aspects of the invention may be noted the provision of a method for manufacturing an electroless cobalt deposition composition which enhances the performance of the solution by minimizing dissolved oxygen in the solution. Besides oxidizing $Co^{2+}$ ions to $Co^{3+}$ ions, oxygen itself negatively affects the deposit quality and device performance. An electroless cobalt deposition composition prepared according to this method is characterized by extended shelf life and improved plating performance. The improved plating composition results in defect-free or very low defectivity Co deposits for use as capping layers in microelectronic devices.

Briefly, therefore, the invention is directed to a method of preparing an aqueous electroless deposition composition for electrolessly depositing Co or a Co alloy onto a substrate in manufacture of microelectronic devices, the method comprising treating water with a deoxygenating treatment to yield treated water having an oxygen concentration below about 5 ppm, and adding a source of $Co^{2+}$ ions to yield an aqueous electroless Co deposition composition comprising at least about 2 g/L $Co^{2+}$ ions and an oxygen concentration no greater than 5 ppm.

In another aspect the invention is directed to a method of preparing an aqueous electroless deposition composition for electrolessly depositing Co or a Co alloy onto a substrate in manufacture of microelectronic devices, the method comprising treating water with a deoxygenating treatment to yield treated water having an oxygen concentration below about 5 ppm; and adding a source of $Co^{2+}$ ions, a B-based or P-based reducing agent, and a complexing agent to the treated water to yield an aqueous electroless Co deposition composition comprising at least about 0.5 g/L $Co^{2+}$ ions and an oxygen concentration no greater than 5 ppm.

In another aspect the invention is directed to a method of preparing an aqueous electroless deposition composition for electrolessly depositing Co or a Co alloy onto a substrate in manufacture of microelectronic devices, the method comprising treating a composition containing water and at least about 0.5 g/L $Co^{2+}$ ions with a deoxygenating treatment to yield an aqueous electroless Co deposition composition comprising at least about 0.5 g/L $Co^{2+}$ ions and an oxygen concentration no greater than 5 ppm.

Other objects and features of the invention will be in part apparent and in part pointed out hereinafter.

DETAILED DESCRIPTION OF PREFERRED EMBODIMENT(S)

Figure 1:
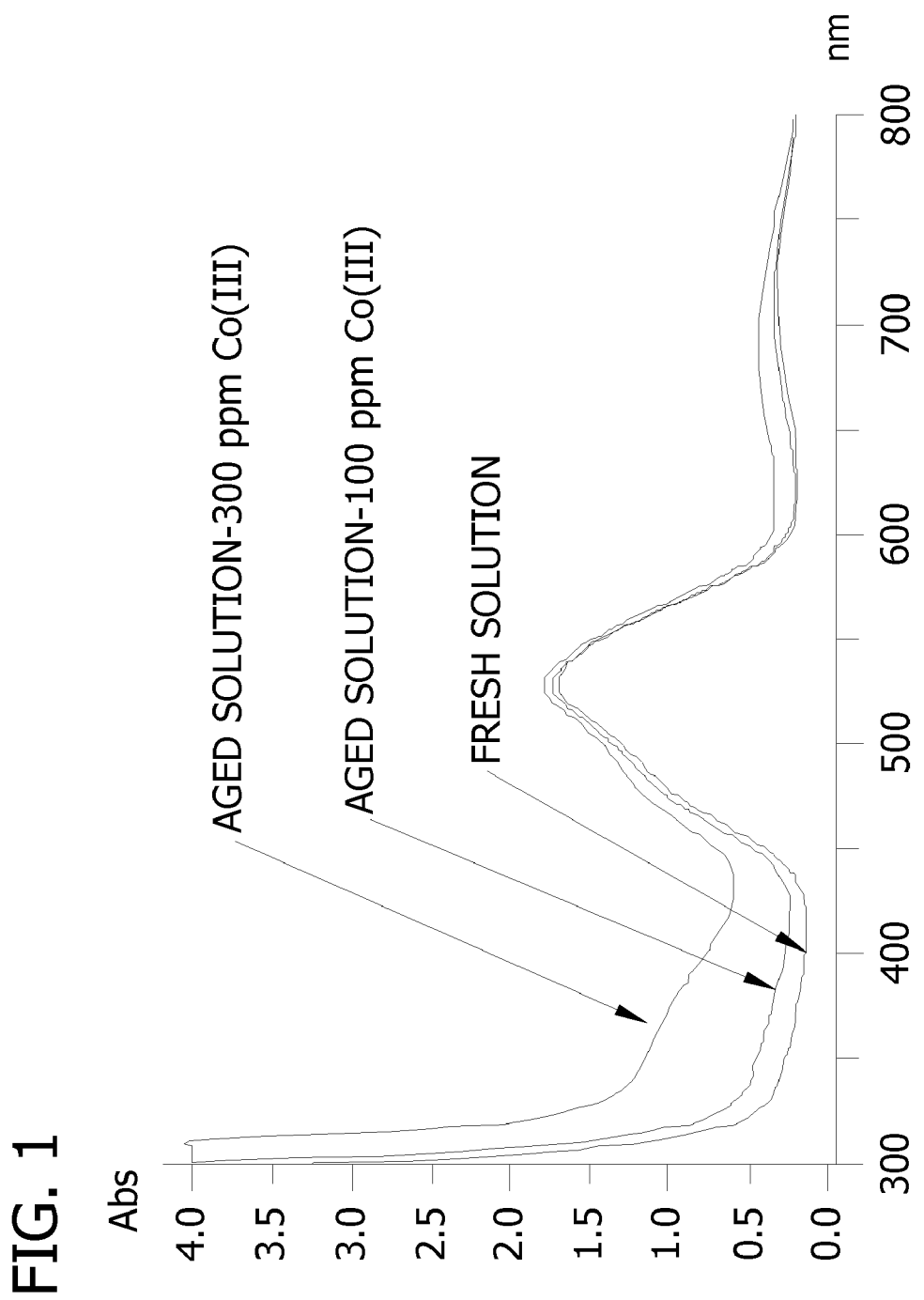
FIG. 1 is a UV-Vis spectrum for measuring the $Co^{3+}$ ion concentration in fresh and aged electroless cobalt deposition compositions. The spectrum was obtained according to the method of Example 1.

In accordance with the invention, Co and Co alloys are deposited from electroless cobalt deposition compositions manufactured using methods for substantially reducing the oxygen ($O_2$) concentration in the composition. Compositions prepared according to the methods described herein are more stable in terms of performance reproducibility than conventionally prepared compositions, as evinced by their extended shelf lives and working bath life. The compositions manufactured according to this method plate uniform cobalt deposits with excellent selectivity and enhanced smoothness and planarity. Additionally, the deposit is substantially free of nodular growth and isolated alloy particles on the dielectric and on top of plated cobalt deposits. For example, a smooth electroless cap can be electrolessly deposited over an interconnect feature in a microelectronic device. The invention is described here in the context of Co-based caps, but is also applicable to other electroless Co applications in the microelectronics industry.

The present invention stems from the discovery that depositing a Co-based cap from an electroless deposition composition which has been prepared according to a controlled manufacturing process which substantially reduces oxygen content in the composition improves the overall topography and morphology of the deposit. The manufacturing process reduces oxygen content by adding oxygen scavengers and anti-oxidants to the composition and/or by deoxygenating water used to make the composition by treatments such as purging with $N_2$ and/or another inert gas, applying a vacuum, sonicating, heating, and passing over a gas transfer membrane and/or by deoxygenating the solutions during mixing and before packaging. Compositions manufactured according to the processes described herein show improved bath stability and reproducibility, and plated alloys are characterized by reduced particle formation on the dielectric surface between Cu features, improved surface roughness, reduced pit formation, and refined grain size for better morphology.

Bath degradation and plated deposit defectivity can be traced, at least in part, to the oxidation of $Co^{2+}$ ions in solution to $Co^{3+}$ ions by dissolved oxygen, which may enter the composition during manufacturing of the composition and during storage. Dissolved oxygen is present in the electroless deposition compositions because, unless conditions are carefully controlled, water absorbs oxygen from the atmosphere. Since the atmosphere comprises about 79% nitrogen gas and about 21% oxygen gas with trace amounts of carbon dioxide and other gases, water exposed to the atmosphere will contain these gases, as predicted by Henry's Law and Dalton's Law. Water exposed to the atmosphere under normal conditions therefore contains at least about 7 ppm oxygen, such as about 7-10 ppm oxygen, about 13-15 ppm nitrogen, and trace amounts of carbon dioxide and other gases. It is thought that the oxygen concentration in water exposed to the atmosphere is sufficient to oxidize enough $Co^{2+}$ to $Co^{3+}$ to significantly affect deposition bath performance and the quality of the plated deposit.

Accordingly, water used to prepare the electroless deposition compositions of the present invention is subjected to one or more techniques during the manufacturing process to reduce the concentration of dissolved oxygen therein.

In one aspect, this invention is directed to adding oxygen scavengers for use in certain embodiments of electroless compositions. Typically electroless cobalt deposition compositions contain chelated $Co^{2+}$ ions when solution pH is higher than 7.5. In the presence of dissolved oxygen and chelator, $Co^{2+}$ ions tend to oxidize to form $Co^{3+}$ ions. Also, Co solutions have poor shelf life due to the ease of oxidation of $Co^{2+}$ to $Co^{3+}$. Besides the storage conditions, the ease of oxidation of $Co^{2+}$ ions in solution is formulation dependent. Degradation is faster if there is an ammonium-containing component such as ammonia, DEA, TEA, or the like. Degradation is typically slower in non-ammonium systems. $Co^{3+}$ ions decrease bath activity, and, in extreme cases, may eventually prevent alloy plating. Additionally, $Co^{3+}$ ions form low solubility salts, such as cobalt citrate, cobalt chloride, and cobalt hydroxide, with components of the composition, causing the formation of particles in the bath. This problem is especially relevant to the alkaline compositions used for electroless Co plating. There are several pathways for $Co^{2+}$ ion oxidation inhibition during manufacturing and packaging.

In one aspect, the applicants have discovered that the use of certain oxygen scavengers, especially a select few which do not unduly interfere with initiation and/or deposition selectivity, inhibits Co oxidation and improves the shelf life of the solutions. A preferred oxygen scavenger for the electroless deposition compositions of the present invention is ascorbic acid. Other preferred oxygen scavengers include sulfites such as $SO_3^{2-}$ and $HSO_3^-$. Examples of $SO_3^{2-}$ sulfites include sodium sulfite, potassium sulfite, and ammonia sulfite. Other organic chemicals such as hydroquinone, catechol, and resorcinol are suitable for this application. Hydrazine is also effective. Besides shelf life improvement, the addition of these additives to the baths reduces the induction time of cobalt deposition, thus preventing Cu erosion from the plating solution during the initiation period, which may cause grain decoration and pitting defects. In one embodiment, therefore, the oxygen scavenger is selected from the group consisting of $SO_3^{2-}$, $HSO_3^-$, hydroquinone, catechol, resorcinol, hydrazine, and combinations thereof. In another embodiment, the oxygen scavenger is selected from the group consisting of $SO_3^{2-}$, $HSO_3^-$, hydroquinone, catechol, resorcinol, and combinations thereof. In another embodiment, the oxygen scavenger is $SO_3^{2-}$, $HSO_3^-$, or a combination thereof.

In the baths of the invention, the concentration of ascorbic acid may be between about 0.1 g/L and about 5 g/L, preferably between about 0.5 g/L and about 2 g/L. The concentration of the sulfites may be between about 0.01 g/L and about 1 g/L, preferably between about 0.01 g/L and about 0.3 g/L. The concentration of the hydroquinone, catechol, and/or resorcinol, where they are selected, is between about 0.01 g/L and about 0.5 g/L, preferably between about 0.01 g/L and about 0.1 g/L. When hydrazine is selected, its concentration is between about 0.01 g/L and about 0.5 g/L, preferably between about 0.01 g/L and about 0.1 g/L. At least about 0.01 g/L hydrazine is required to impart significant oxygen scavenging effect in most applications.

The reaction between hydrazine and oxygen which effects oxygen removal can be expressed as follows:

$$N_2H_{4(aq)} + O_{2(aq)} => N_{2(g)} + 2H_2O_{(l)}$$

The reaction is stoichiometric, requiring equal amounts of hydrazine and oxygen to reach completion. At ambient temperatures this reaction proceeds very slowly.

The concentration of the oxygen scavenger is selected to be at least enough to consume oxygen dissolved in the solution during manufacture and packaging, with some excess for bottle breathing. On the other hand, the concentration is selected not to be so high as to have a negative effect on plating. These additives can also be used in other non-metal containing solutions as oxygen scavengers to improve the plating bath performance by preventing oxidation of compounds in the solution and limit the dissolved oxygen in the bath.

In another aspect, the manufacturing process includes a water degassing (i.e., deoxygenating) process to deoxygenate water used to prepare the electroless deposition composition for plating Co or Co alloys prior to packaging. Methods of deoxygenating water include bubbling $N_2$, Ar, or other inert gas through the water to effect oxygen purging; heating; applying a vacuum to the water; sonicating; and/or passing water through a gas transfer membrane. In this aspect the invention involves treating water with a deoxygenating treatment to yield treated water having an oxygen concentration below about 5 ppm; and adding a source of $Co^{2+}$ ions to yield an aqueous electroless Co deposition composition comprising at least about 0.5 g/L $Co^{2+}$ ions and an oxygen concentration no greater than 5 ppm. In further aspect, the manufacturing process includes solution degassing during mixing and/or after mixing to yield low oxygen content electroless cobalt deposition composition solutions. For example, in this aspect it involves treating a composition containing water and at least about 0.5 g/L $Co^{2+}$ ions and optionally the reducing agent with a deoxygenating treatment to yield an aqueous electroless Co deposition composition comprising at least about 0.5 g/L $Co^{2+}$ ions and an oxygen concentration no greater than 5 ppm. All of the deoxygenating methods described herein are applicable to these embodiments where deoxygenation is performed before mixing, during mixing, or after mixing.

Inert gas purging can be used to remove oxygen from water or electroless cobalt deposition composition solutions. Purging removes dissolved gases from a solution by bubbling a different inert gas through the liquid. Nitrogen gas can be used to aid in removal of dissolved oxygen gas, preferably when the liquid to be degassed is refluxing under positive nitrogen pressure. Nitrogen gas purging can be expected to reduce the oxygen content in water to be about 0.01 ppm to about 0.1 ppm. Applicable inert gases include nitrogen, argon, and other noble gases. These gases are preferably high purity, preferably containing no oxygen. Flow rates into the composition can range from a few cubic centimeters per minute to several hundred cubic centimeters per minute. The duration is based in part on the total volume of the composition to be purged and in part on the gas flow rate. Purge durations typically last from several minutes to several tens of minutes.

Heating can also be used to remove dissolved gases, such as oxygen. Contrary to what is observed with most dissolved solids, the solubility of gas decreases as temperature increases. The decrease in solubility of gases with increasing temperature is an example of the operation of Le Chatelier's principle. The heat or enthalpy change of the dissolution reaction of most gases is negative, which is to say the reaction is exothermic. As a consequence, increasing the temperature leads to gas evolution. In general, the solubility of oxygen can be estimated by the equation:

$$\text{Solubility (mg/L)} = \frac{468}{31.6 + t},$$

wherein t is in ° C. Accordingly, to effect sufficient removal of oxygen from water used to prepare electroless deposition compositions of the invention, the water can be heated to an elevated temperature. In one embodiment it is heated to a temperature below boiling such as a temperature not greater than about 85° C. The temperature is preferably held sufficiently low such as below boiling to minimize evaporative losses. Heating may occur under an ambient comprising nitrogen, argon, or other noble gases. In a preferred embodiment, it is performed for between about 10 and about 30 minutes. In some aspects, heating may occur under reduced pressure to effect better oxygen removal. Heating can be expected to reduce the oxygen content in water to be between about 0 ppm and about 5 ppm, more preferably between about 0 ppm and about 0.01 ppm.

Water may be subjected to a vacuum to effect oxygen removal. An exemplary method of removing oxygen by vacuum is applying the water to a vacuum tower. In this method, water is applied to the top of a baffled tower, where it is broken into thin films. Breaking the water into thin films according to this method achieves a large surface contact area for gas diffusion out of the water. As the water flows through the baffled tower, it is subjected to a vacuum which lowers the vapor pressure in contact with the water and drives dissolved gases out of the water and into the vacuum. Variations on the vacuum tower process are possible. For example, a pure, inert gas, such as nitrogen gas or argon gas can be flowed through the tower with the water in order to dilute the oxygen pressure as it is removed from the water. Heat may also be applied to the tower to lower the solubility of the gas in water.

Sonication can effect removal of dissolved oxygen from water. Sonication involves the application of ultrasonic waves to a liquid. Ultrasound waves have frequencies greater than those which can be heard by the human ear, which is typically about 20 kHz. The application of ultrasonic waves forms millions of microscopic cavitation events in the liquid. Sound waves stress these bubbles, causing them to grow, contract, and eventually implode. With implosion, energy is released in the form of localized heat and pressure. The effect of energy release is lower solubility of dissolved gases in the liquid, which can cause their diffusion from the liquid into the atmosphere.

Water may be passed through a gas transfer membrane to remove oxygen. In this process, water is passed on one side of a hydrophobic membrane with a pore size of less than about 0.3 µm and inert gas, such as nitrogen, is flowed on the other side of the membrane. Because the membrane is hydrophobic, water does not easily pass through the membrane. However, gas may easily diffuse through both sides of the membrane. Gas which has diffused from the water side of the membrane to the inert gas side is carried away by the flowing inert gas, such that the gas content is continually decreased as the water flows over the gas transfer membrane. The level of deoxygenation is limited by the purity of the inert gas and the contact area of the gas transfer membrane. An exemplary gas transfer membrane system is Liqui-Cel® available from Membrana (a Polypore Company, Charlotte, N.C.).

Any of the above-described methods may be used, alone or in combination, to prepare an electroless cobalt deposition composition having reduced oxygen concentration. In accordance with this method, employing the foregoing aspects, the concentration of $O_2$ is reduced to less than about 5 ppm, and preferable less than about 2 ppm. In certain embodiments, the concentration of $O_2$ is reduced to less than about 1 ppm, and preferable less than about 0.5 ppm. Compositions prepared according to the present method are effective at inhibiting $Co^{2+}$ oxidation to $Co^{3+}$ and inhibiting the oxidation of other bath additives commonly used in electroless cobalt deposition compositions. Accordingly, the electroless deposition compositions reliably plate Co or Co alloy with minimal induction time and plate Co or Co alloy deposits which are characterized by minimal defectivity or may even be defect free.

The electroless deposition compositions of the present invention for electroless plating of Co or Co alloys such as in a metal capping layer onto a metal-filled interconnect may be processed according to any one of the above methods or may be subjected to more than one of the above-described processes to minimize the oxygen concentration in the composition. Accordingly, the compositions can comprise an oxygen scavenger and are characterized by low oxygen concentrations. Electroless deposition compositions comprise a source of cobalt ions, a reducing agent, and a complexing and/or chelating agent. The bath is buffered within a certain pH range. Optionally, the bath may also comprise a source of refractory ions.

For the deposition of the Co-based alloy, the bath comprises a source of Co ions. In the context of capping of electrical interconnects, Co-based alloys provide several advantages. They do not significantly alter the electrical conductivity characteristics of Cu. Cobalt provides good barrier and electromigration protection for Cu. Cobalt, which is selected in significant part because it is immiscible with Cu, does not tend to alloy with Cu during assembly or over time during service. The Co ions are introduced into the solution as an inorganic Co salt such as the hydroxide, chloride, sulfate, or other suitable inorganic salt, or a Co complex with an organic carboxylic acid such as Co acetate, citrate, lactate, succinate, propionate, hydroxyacetate, or others. $Co(OH)_2$ may be used where it is desirable to avoid overconcentrating the solution with $Cl^-$ or other anions. The $Co^{2+}$ ion concentration is typically at least about 0.5 g/L. The $Co^{2+}$ ion concentration is typically no greater than about 20 g/L. In one embodiment, the Co salt or complex is added to provide about 2 g/L to about 20 g/L of $Co^{2+}$ to yield a Co-based alloy of high Co metal content. In some applications, the Co content in the electroless bath is very low, for example, as low as between about 0.5 g/L and about 2.0 g/L of $Co^{2+}$.

Depending upon the deposition mechanism and the desired alloy, the reducing agent is chosen from either a phosphorus-based reducing agent or a borane-based reducing agent. The deposition mechanism and the desired alloy dictate the choice of the reducing agent. If an alloy is desired which contains phosphorus, hypophosphite is chosen. If an alloy is desired which contains boron, a borane-based reducing agent is chosen, such as borohydride or a borane. Additionally, both phosphorous and borane-based reducing agents may be added to the plating bath.

Among the phosphorus-based reducing agents, hypophosphite is a preferred reducing agent in electroless plating films because of its low cost and docile behavior as compared to other reducing agents. When hypophosphite is chosen as the reducing agent, the finished alloy contains phosphorus. As is known, the plating solution requires an excess of $H_2PO_2^-$ to reduce $Co^{2+}$ into the Co alloy. As noted in Mallory and Hajdu, pp. 62-68, the molar ratio of Co ions to hypophosphite ions in the plating solution is between 0.25 to 0.60, preferably between 0.30 and 0.45, for example. To ensure that a sufficient concentration of hypophosphite is present in the plating bath for rapid initiation of plating and improved plating morphology, the hypophosphite salt is added in an initial concentration of about 2 g/L to about 30 g/L, for example about 21 g/L. Exemplary hypophosphite salts include ammonium hypophosphite, sodium hypophosphite, and potassium hypophosphite.

Hypophosphite reduces the metal ion spontaneously only upon a limited number of substrates, including Co, Ni, and Pd. Not included in this list is Cu, which is a particular metal of interest for its use in filling interconnect features such as vias and trenches in microelectronic devices. For hypophosphite reduction over a Cu substrate, the Cu surface must first be activated, for example, by seeding with the metal to be deposited (i.e., Co) by treating the surface with a solution comprising a strong reducing agent such as DMAB and ions of the metal to be plated (i.e., $Co^{2+}$) or by seeding with a catalyst such as Pd.

Other preferred reducing agents include the borane-based reducing agents, such as borohydrides (sodium, potassium, cyano, trimethoxy, and tetramethylammonium, among others), monomethyl amine borane, isopropyl amine borane, dimethyl amine borane (DMAB), diethyl amine borane (DEAB), trimethyl amine borane, triethyl amine borane, triisopropyl amine borane, pyridine borane, and morpholine borane. When a borane-based reducing agent is chosen, boron becomes part of the plated alloy. As is known, the plating solution requires approximately equal molar amounts of the borane-based reducing agent to reduce $Co^{2+}$ into the Co alloy. To ensure that a sufficient concentration of reducing agent for self-initiated deposition is present in the plating bath, dimethyl amine borane, for example, is added in an initial concentration of about 0.5 g/L to about 30 g/L, for example about 10 g/L.

Unlike hypophosphite, plating solutions with borane-based reducing agents do not need a copper surface activation step. Instead, the reducing agent catalyzes reduction of the metal ion onto the Cu surface.

Due to the oxidation of the reducing agent, P or B co-deposits with the Co. An effect of these elements in the deposit is to reduce grain size, enhance amorphousness, which can render the microstructure more impervious to Cu diffusion and electromigration. For example, Co—W—B with high W content has an amorphous phase. Without being bound to a particular theory, it is believed that the presence of refractory metal together with B and P improves the barrier properties by filling in the grain boundaries of the crystalline structure of the deposit.

The bath further may contain agents for pH adjustment and buffering agents. The bath pH is typically controlled by one or more pH adjusters and typically contains a pH buffer to stabilize the pH within the desired pH range. In one embodiment, the desired pH range is between about 7.5 and about 10.0. In one embodiment, it is between 8.0 up to around 10. Exemplary agents for pH adjustment include potassium hydroxide (KOH), tetramethylammonium hydroxide (TMAOH), tetraethylammonium hydroxide (TEAOH), tetrapropylammonium hydroxide (TPAOH), tetrabutylammonium hydroxide (TBAOH), ammonia, and other amines. Exemplary buffering agents include, for example, borates, tetra- and pentaborates, phosphates, ammonia, and hydroxyl amines such as monoethanolamine, diethanolamine, triethanolamine, and ethylenediamine, among others. The pH buffer level is on the order of between about 2 g/L and about 50 g/L.

A complexing and/or chelating agent helps to keep Co ions in solution. Because the bath is typically operated at a mildly alkaline pH of between about 7.5 and about 10.0, $Co^{2+}$ ions have a tendency to form hydroxide salts and precipitate out of solution. The complexing agents used in the bath are selected from among citric acid, malic acid, glycine, propionic, succinic, lactic acids, methanolamine (MEA), diethanolamine (DEA), triethanolamine (TEA), and ammonium salts such as ammonium chloride, ammonium sulfate, ammonium hydroxide, pyrophosphate, polyphosphate, and mixtures thereof. Some complexing agents, such as cyanide, are avoided because they complex with Co ions too strongly and can prevent deposition from occurring. The complexing agent concentration is selected such that the molar ratio between the complexing agent and Co is between about 2:1 and about 10:1, generally. Depending on the complexing agent molecular weight, the level of complexing agent may be on the order of between about 10 g/L and about 200 g/L.

If desired, the plating bath may also include a refractory metal ion, such as W or Re, which functions to increase thermal stability, corrosion resistance, and diffusion resistance. Exemplary sources of W ions are tungsten trioxide, tungstic acids, ammonium tungstic acid salts, tetramethylammonium tungstic acid salts, and alkali metal tungstic acid salts, phosphotungstic acid, silicotungstate, other heteropolytungstic acids and other mixtures thereof. For example, one preferred deposition bath contains between about 0.1 g/L and about 10 g/L of tungstic acid. Other sources of refractory metal include rhenium trioxides, perrhenic acids, ammonium perrhenic acid salts, tetramethylammonium perrhenic acid salts, alkali metal perrhenic acid salts, heteropolyacids of rhenium, and other mixtures thereof.

Other additives, as are known in the art such as levelers, accelerators, and grain refiners may also be added. At low concentrations, hydrazine may be added as a leveler, as disclosed in U.S. patent application Ser. No. 11/085,304. Levelers act with the stabilizer of the invention to further enhance deposition morphology and topography, and also to control the deposition rate. Some additives which may be added to the deposition compositions are disclosed in U.S. patent application Ser. No. 11/230,912.

In some applications, the bath must be substantially sodium free, or alkali metal ion free.

Employing the foregoing baths, a variety of alloys can be deposited. For example, Co diffusion barrier layers include Co—W—P, Co—W—B, Co—W—B—P, Co—B—P, Co—B, Co—Mo—B, Co—W—Mo—B, Co—W—Mo—B—P, and Co—Mo—P, among others.

According to the practice of electroless deposition, a layer of Co or Co alloy may be deposited by exposure of the electroless plating compositions to, for example, a patterned silicon substrate having vias and trenches, in which a metal layer, such as Cu, has already filled into the vias or trenches. This exposure may comprise dip, flood immersion, spray, or other manner of exposing the substrate to a deposition bath, with the provision that the manner of exposure adequately achieves the objectives of depositing a metal layer of the desired thickness and integrity.

In applications where the invention is used for capping, surface preparation may be needed for removing organic residues left by CMP and for dissolving Cu oxide from the Cu surface. Unless removed, the oxide can interfere with adhesion of the cap and can detract from electrical conductivity.

Acidic pretreatment involves exposing the substrate to an acid selected from among HCl, $H_2SO_4$, citric acid, methanesulfonic acid, and $H_3PO_4$ to remove CMP residues, Cu oxides, and Cu embedded in the dielectric by CMP. After the acidic pretreatment operation is completed, the substrate is rinsed by, e.g., DI water.

Alternatively or additionally, an alkaline pretreatment employs basic cleaner for removing oxide from the metal interconnect feature. This cleaner preferably removes all the oxide, for example copper oxide, without removing substantial amounts of the metallization in the interconnects. Typical basic cleaners contain TMAOH with addition of hydroxylamine, MEA, TEA, EDA (ethylenediamine), or DTA (diethylenetriamine) at pH range of 9 to 12. A water rinse follows the alkaline pretreatment.

The electroless plating compositions according to the present invention may be used in conventional continuous mode deposition processes. In the continuous mode, the same bath volume is used to treat a large number of substrates. In this mode, reactants must be periodically replenished, and reaction products accumulate, necessitating periodic removal of the plating bath. Preferably, in this mode, the bath contains an initially high concentration of metals ions for depositing onto the substrate. Alternatively, the electroless plating compositions according to the present invention are suited for so-called "use-and-dispose" deposition processes. In the use-and-dispose mode, the plating composition is used to treat a substrate, and then the bath volume is directed to a waste stream. Although this latter method may be more expensive, the use and dispose mode requires no metrology, that is, measuring and adjusting the solution composition to maintain bath stability is not required. It is advantageous from a cost perspective to use lower concentrations of metal ions when working in "use-and-dispose" mode.

For auto-catalyzation of the electroless deposition, borane-based reducing agents may be employed such as, for example borohydrides (sodium, potassium, cyano-, trimethoxy, and tetramethylammonium, among others), monomethyl amine borane, isopropyl amine borane, dimethyl amine borane (DMAB), diethyl amine borane (DEAB), trimethyl amine borane, triethyl amine borane, triisopropyl amine borane, pyridine borane, and morpholine borane, mixtures thereof, or mixtures thereof with hypophosphite. Oxidation/reduction reactions involving the borane-based reducing agents and Co deposition ions are catalyzed by Cu. In particular, at certain plating conditions, e.g., pH & temperature, the reducing agents are oxidized in the presence of Cu, thereby reducing the deposition ions to metal which deposits on the Cu. The process is preferably substantially self-aligning in that the metal is deposited essentially only on the Cu interconnect. However, conventional electroless plating baths deposit a Co alloy that amplifies the roughness of the underlying Cu interconnect. In many instances, stray Co is deposited onto the dielectric. If the additives are added to the plating solution, as in the present invention, the electroless plating bath deposits a smooth and level Co or Co alloy capping layer without stray deposition onto the dielectric.

As an alternative, certain embodiments of the invention employ an electroless deposition process which does not employ a reducing agent which renders Cu catalytic to metal deposition. For such processes a surface activation operation is employed to facilitate subsequent electroless deposition. A currently preferred surface activation process utilizes a Pd immersion reaction. Other known catalysts are suitable and include Rh, Ru, Pt, Ir, and Os. Alternatively, the surface may be prepared for electroless deposition by seeding as with, for example, Co seeding deposited by electroless deposition, electrolytic deposition, PVD, CVD, or other technique as is known in the art.

Plating typically occurs at a bath temperature of between about 50° C. to about 90° C. If the plating temperature is too low, the reduction rate is too low, and at a low enough temperature, Co reduction does not initiate at all. At too high a temperature, the plating rate increases, and the bath can become too active. For example, Co reduction can become less selective, and Co plating may occur not just on the Cu interconnect features of a wafer substrate, but also on the dielectric material. Further, at very high temperatures, Co reduction can occur spontaneously within the bath plating solution and on the sidewalls of the plating tank. Plating rates achievable using the electroless deposition compositions of the present invention may be between about 50 Å/minute and about 300 Å/minute. Plating typically occurs for between about 1 minute and about 3 minutes. Accordingly, Co alloy capping layers having thicknesses between 50 Å and about 300 Å are routinely achieved, which capping layers are substantially defect free, uniform, and smooth as electrolessly deposited.

Optionally, the capping layers can be subjected to a post deposition cleaning to improve the yield.

The following examples further illustrate the invention.

EXAMPLE 1

Oxidation of Co(II) to Co(III) in Electroless Deposition Compositions with Solution Aging An electroless cobalt deposition composition was prepared, separated into samples, aged, and subjected to UV-Vis spectra analysis. See FIG. 1, which has wavelength (nm) on the x axis and absorbance on the y axis. The lower curve is analysis of a fresh solution; the middle curve is analysis of a solution aged for six months with limited air exposure. The upper curve is analysis of a solution aged for four months with extensive air and light exposure. These results show that absorbance in the range of 300 nm to 480 nm increases after the solutions were exposed to air and UV light for certain periods of time. Depending on exposure time and intensity, increases of the solution absorbance vary at wavelength shorter than 480 nm. The absorbance increase is believed mainly due to the formation of Co(III) species in the solutions. Similar absorbance changes were observed for the solutions spiked with trace amount of Co(III) species (graphs not shown). Linear absorbance increase was obtained at 380 nm wavelength for Co(III) concentration from 5 to 1000 ppm. The amount of Co(III) in the two aged solutions shown in FIG. 1 was therefore estimated to be about 100 ppm (middle curve) and 300 ppm (upper curve), respectively. Visual color change was observed for the solutions with longer time of air and light exposure.

EXAMPLE 2

Figure 2:
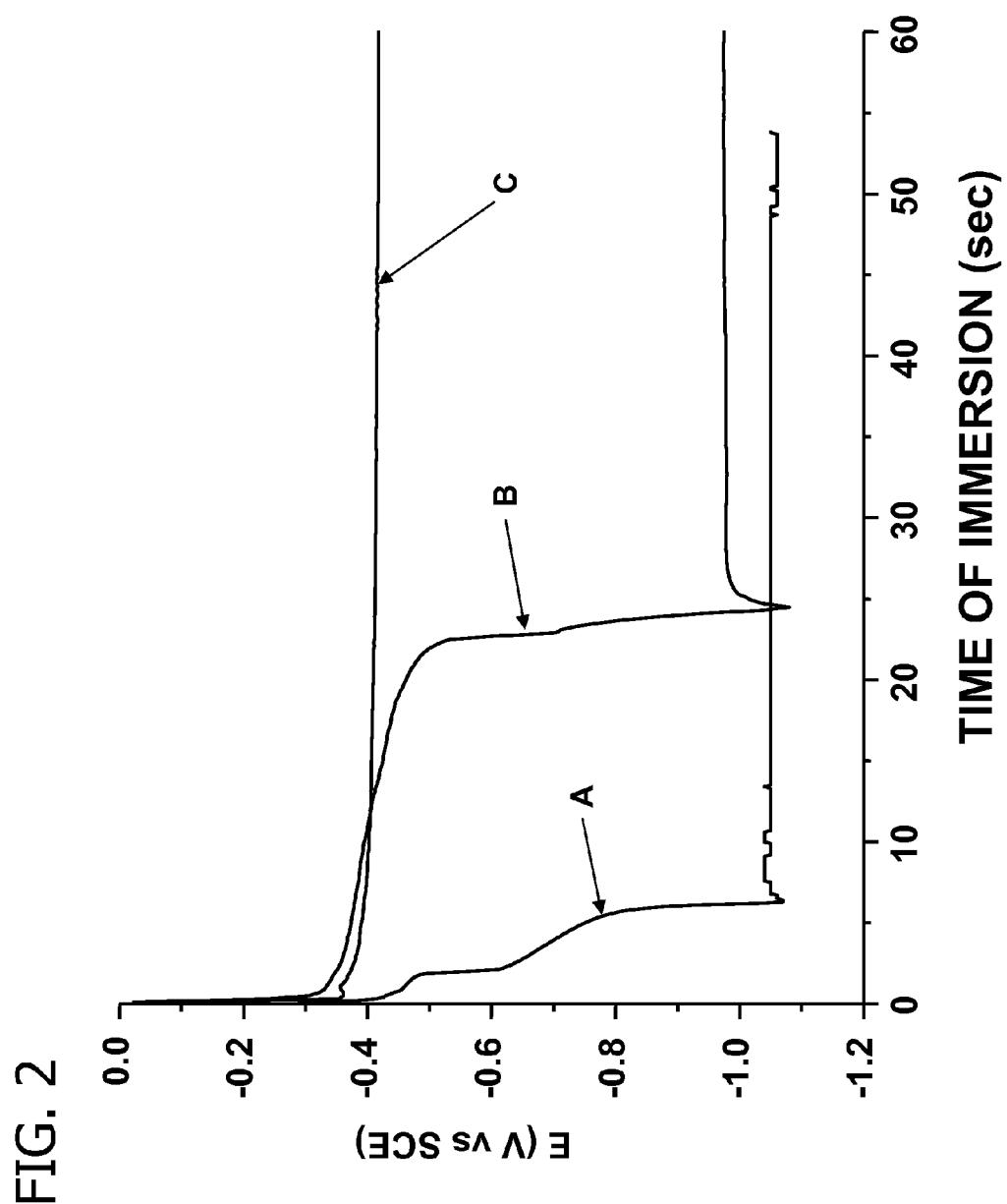
FIG. 2 is a graph depicting the induction times for electroless cobalt deposition compositions, which are freshly made, aged such that about 2% of the cobalt ion has oxidized, and aged such that about 10% of the cobalt ion has oxidized. The graph was obtained according to the method of Example 2.

Determination of Induction Time for Electroless Deposition Compositions Comprising Known Concentrations of Co(III) Ion The induction times of fresh and aged electroless cobalt deposition compositions were measured. FIG. 2 is a graph depicting the induction times for the compositions: (A) freshly made solution having less than 0.1% oxidation, (B) aged solution having about 2% oxidation, and (C) aged solution having about 10% oxidation. It can be seen from the graph depicted in FIG. 2 that even a low extent of oxidation to Co(III) ion can lengthen Co deposition induction, and about 10% oxidation can prevent induction altogether for commercially practical purposes.

EXAMPLE 3

Determination of Deposition Height Variance for Electroless Deposition Compositions Comprising Known Concentrations of Co(III) Ion Co(III) ions may affect the deposit thickness at different features of a patterned wafer substrate. To examine this phenomenon, two electroless cobalt deposition compositions were prepared having known Co(III) concentrations. Composition 1 is a Pd activated system while composition 2 is a self-initiated system. Samples of each composition, either as freshly prepared or aged for 6 months to allow cobalt oxidation to occur, were used to deposit cobalt alloy over dense and isolated features in a patterned wafer substrate. The deposit thicknesses over isolated and dense features from fresh and aged electroless cobalt deposition compositions are shown in the following Table I.

TABLE I

|  | Thickness of Co Deposits | | | |
| --- | --- | --- | --- | --- |
|  | Composition 1 | | Composition 2 | |
| Deposit thickness (Å) | fresh | aged | fresh | aged |
| Dense features | 120 ± 10 | None | 105 ± 16 | 85 ± 5 |
| Isolated features | 113 ± 16 | none | 100 ± 14 | 66 ± 6 |
| Co(III) concentration (Co(III)/Co(II) ratio %) | NA | ~1.2% | NA | ~0.1% |

EXAMPLE 4

Cobalt Alloys Depositing from Fresh and Aged Electroless Cobalt Deposition Compositions Optical images were obtained of the deposits on dense features of the alloys plated according to the method of Example 3. The substrates in each case had exposed patterned Cu wires embedded in Ta/TaN stack barrier surrounded with interlevel dielectric (ILD) made of $SiO_2$-based material. The Cu wires had a width on the order of 120 nm, and after CMP, the Cu surface was about the same height as the surrounding dielectric. The surface roughness was about 5 Å.

The patterned Cu substrates were exposed to as acidic pre-clean solution to remove post-CMP inhibitor residues, copper (II) oxide layer, and post-CMP slurry particles from ILD. It was then rinsed in deionized (DI) water before deposition.

Figure 3A:
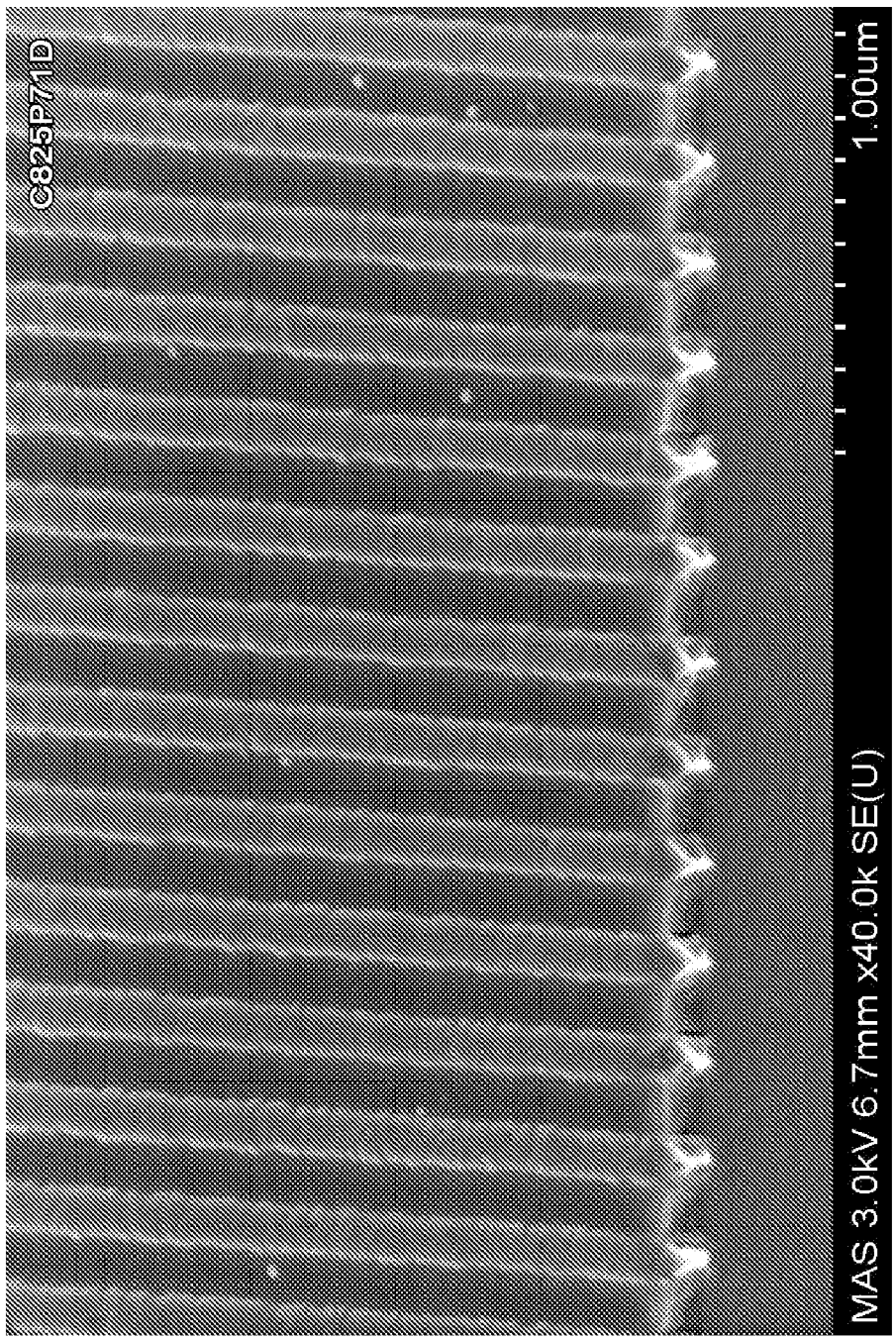
FIGS. 3A and 3B are SEM images of electroless deposited cobalt caps from an electroless cobalt deposition composition which is freshly made (FIG. 3A) and from an aged electroless cobalt deposition composition (FIG. 3B). The SEM images were obtained according to the method of Example 4.
Figure 3B:
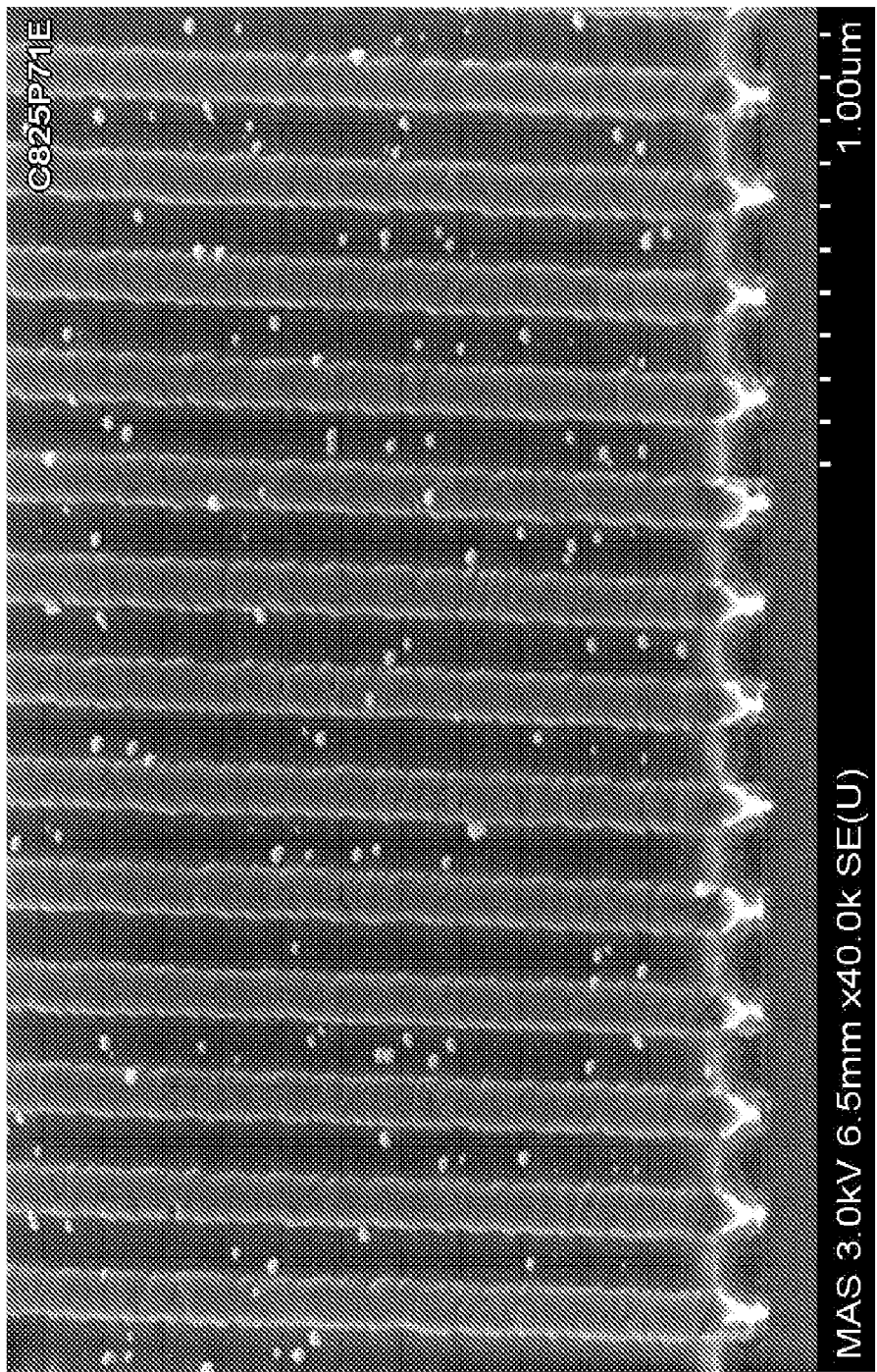

FIG. 3A is a SEM image of the substrate plated from a fresh electroless cobalt deposition composition, and FIG. 3B is a SEM image of the substrate plated from an aged electroless cobalt deposition composition. As can be seen in FIG. 3B, severe modulation along the Cu/dielectric barrier interface and particle formation on the dielectric surface are observed for the cap plated from the aged composition. This results from a lack of composition selectivity. This Co—W—B—P capping layer has an increased risk of causing an electrical short. The modulation and particle formation is substantially reduced in the Co—W—B—P capping layer deposited from the fresh composition. In contrast, the substrate of FIG. 3A plated from a fresh solution shows a very low density of nodules or particles on dielectric surfaces or along the Cu/dielectric barriers.

Figure 4A:
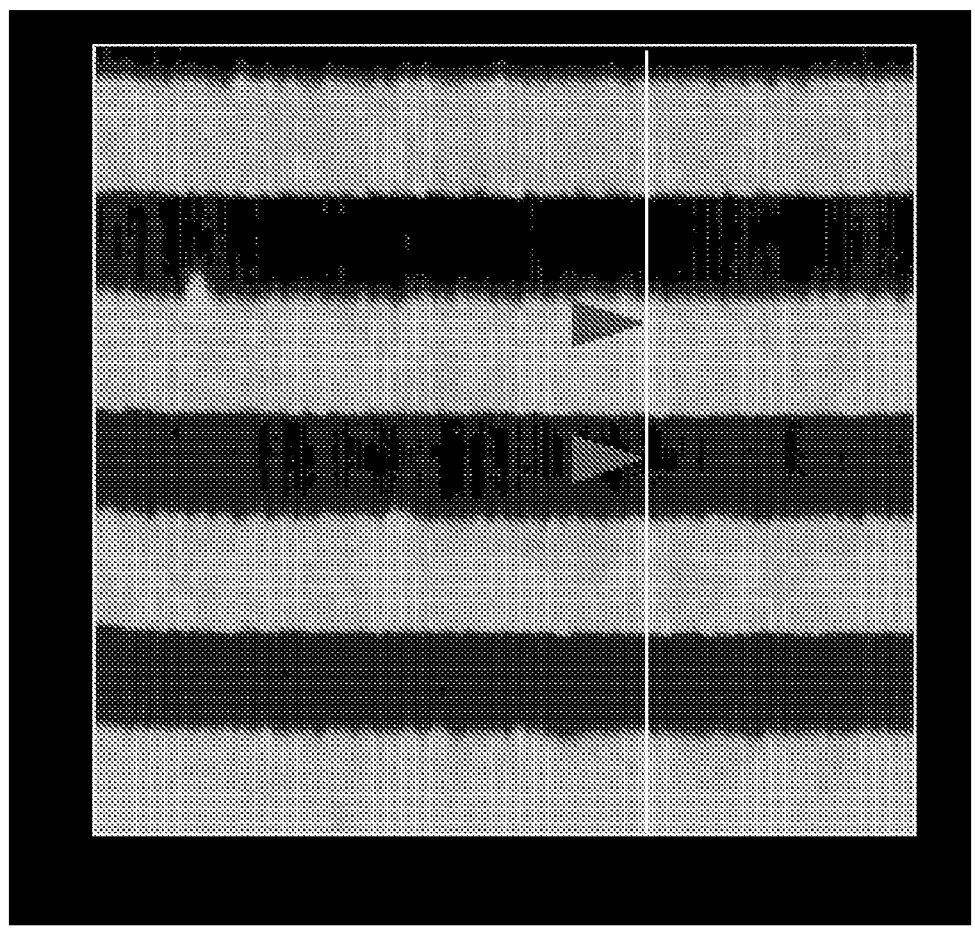
FIGS. 4A and 4B are AFM images of electroless deposited cobalt caps from a electroless cobalt deposition composition which is freshly made (FIG. 4A) and from an aged electroless cobalt deposition composition (FIG. 4B). The AFM images were obtained according to the method of Example 4.
Figure 4B:
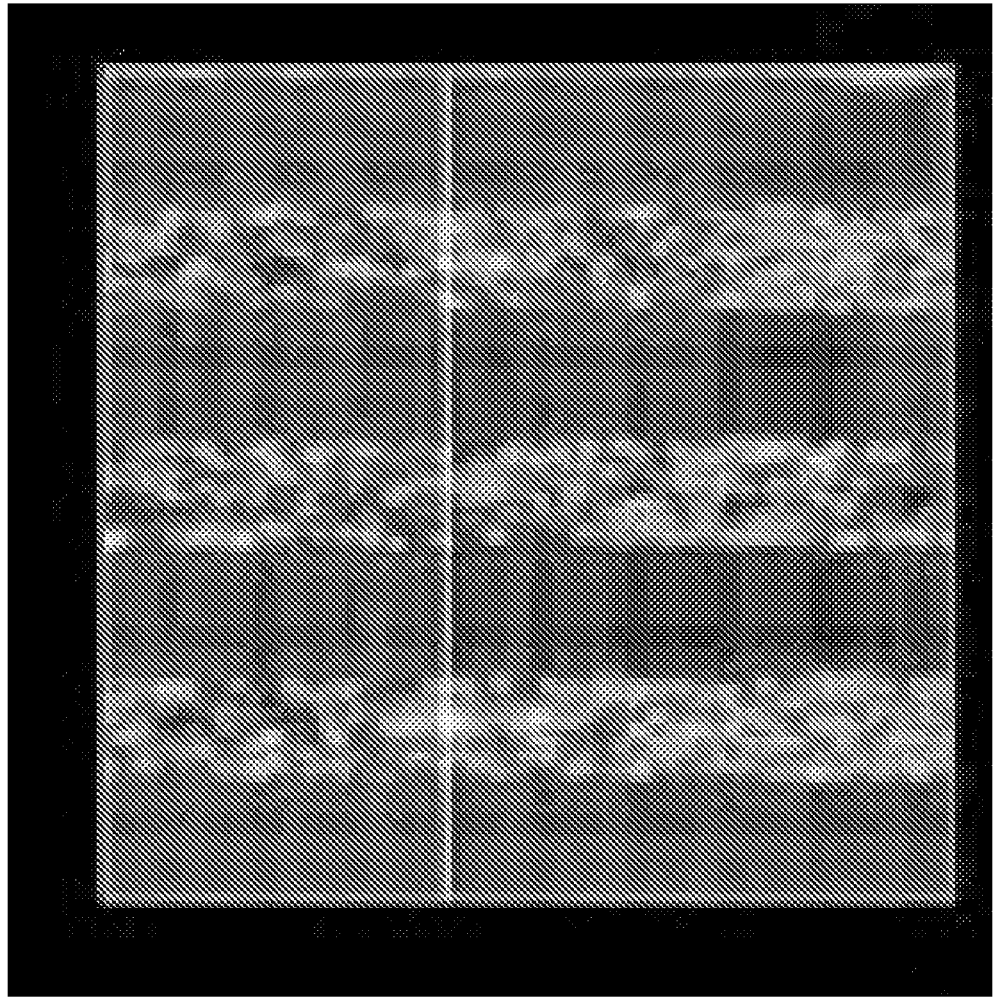

FIG. 4A is an AFM image of the substrate plated from a fresh electroless cobalt deposition composition, and FIG. 4B is an AFM image of the substrate plated from an aged electroless cobalt deposition composition. As can be seen in FIG. 4B, the plated deposit is characterized by surface roughness. The deposit plated from the fresh composition is substantially smoother.

EXAMPLE 5

Electroless Deposition Composition Comprising Oxygen Scavenger for Plating a Quaternary Alloy Comprising Co—W—B—P An electroless plating bath was prepared comprising the following components:
2-30 g/L $CoCl_2.6H_2O$
5-60 g/L $C_6H_8O_7$ (citric acid)
0.1-8 g/L $H_2WO_4$ (tungstic acid)
0.5-6 g/L $(CH_3)_2NHBH_3$ (DMAB)
2-15 g/L $NH_4H_2PO_2$ (Ammonium hypophosphite)
0.5-2 g/L Ascorbic acid
pH adjusted to between 8.0 and 9.5.
One liter of this bath was prepared at room temperature.

COMPARATIVE EXAMPLE 5

Electroless Deposition Composition Comprising Oxygen Scavenger for Plating a Quaternary Alloy Comprising Co—W—B—P An electroless plating bath was prepared comprising the following components:
2-30 g/L $CoCl_2.6H_2O$
5-60 g/L $C_6H_8O_7$ (citric acid)
0.1-8 g/L $H_2WO_4$ (tungstic acid)
0.5-6 g/L $(CH_3)_2NHBH_3$ (DMAB)
2-15 g/L $NH_4H_2PO_2$ (Ammonium hypophosphite)
pH adjusted to between 8.0 and 9.5.
One liter of this bath was prepared at room temperature according to the same protocol as used for Example 5 except for the addition of the ascorbic acid oxygen scavenger.

EXAMPLE 6

Figure 5:
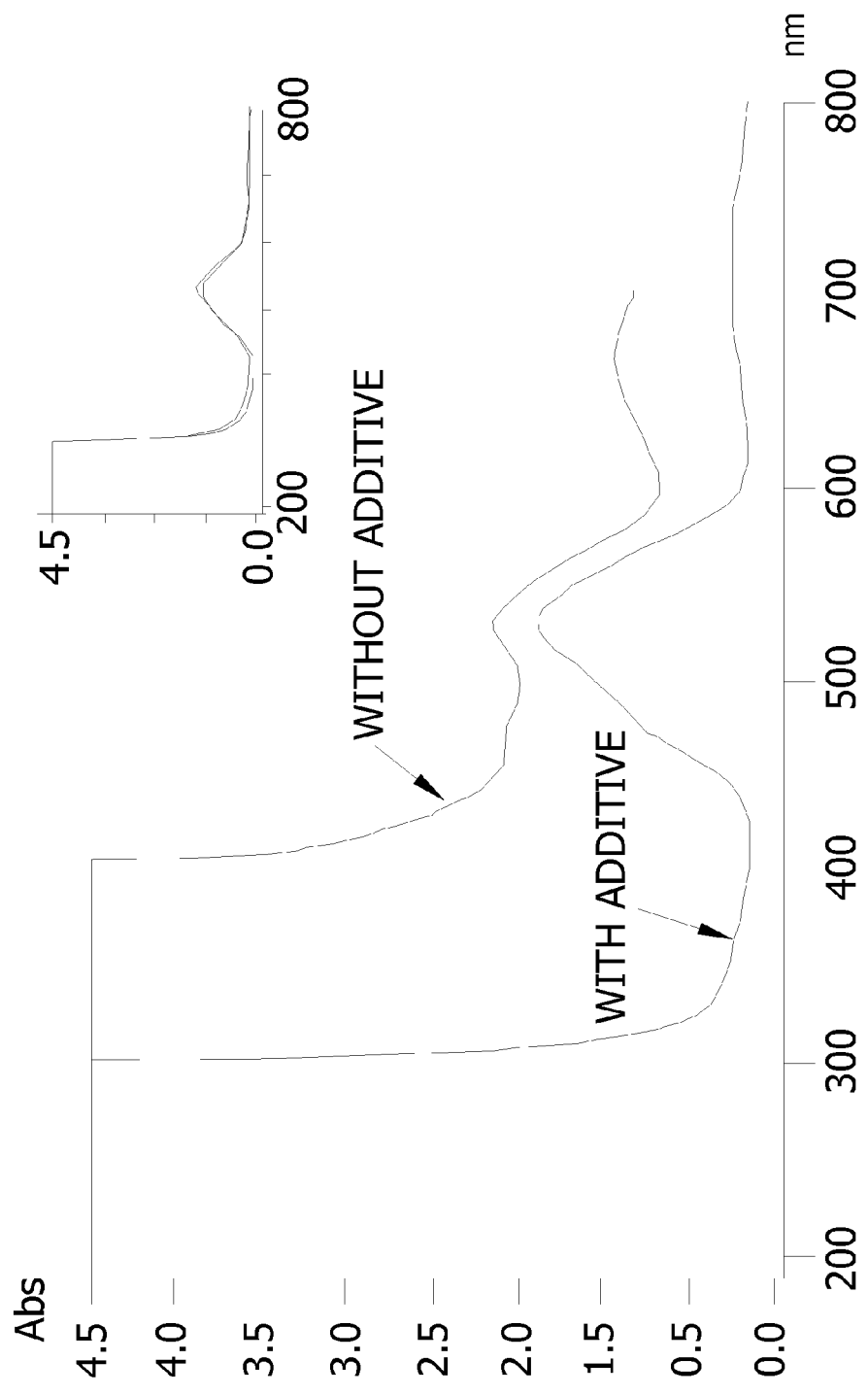
FIG. 5 is a UV-Vis spectrum indicating the inhibition of $Co^{3+}$ ion formation in an electroless cobalt deposition composition of Example 5 (with added ascorbic acid oxygen scavenger) and Comparative Example 5 (without ascorbic acid oxygen scavenger). The UV-Vis spectrum was obtained according to the method of Example 6.

Co(III) Ion Concentration in Electroless Cobalt Deposition Compositions With and Without Oxygen Scavenger The samples of Example 5 and Comparative Example 5 were exposed to air and UV light for four months. FIG. 5 is the UV-Vis spectra showing the reduced concentration of Co(III) ion in the electroless deposition composition of Example 5, containing the oxygen scavenger, as opposed to that of Comparative Example 5.

EXAMPLE 7

Figure 6:
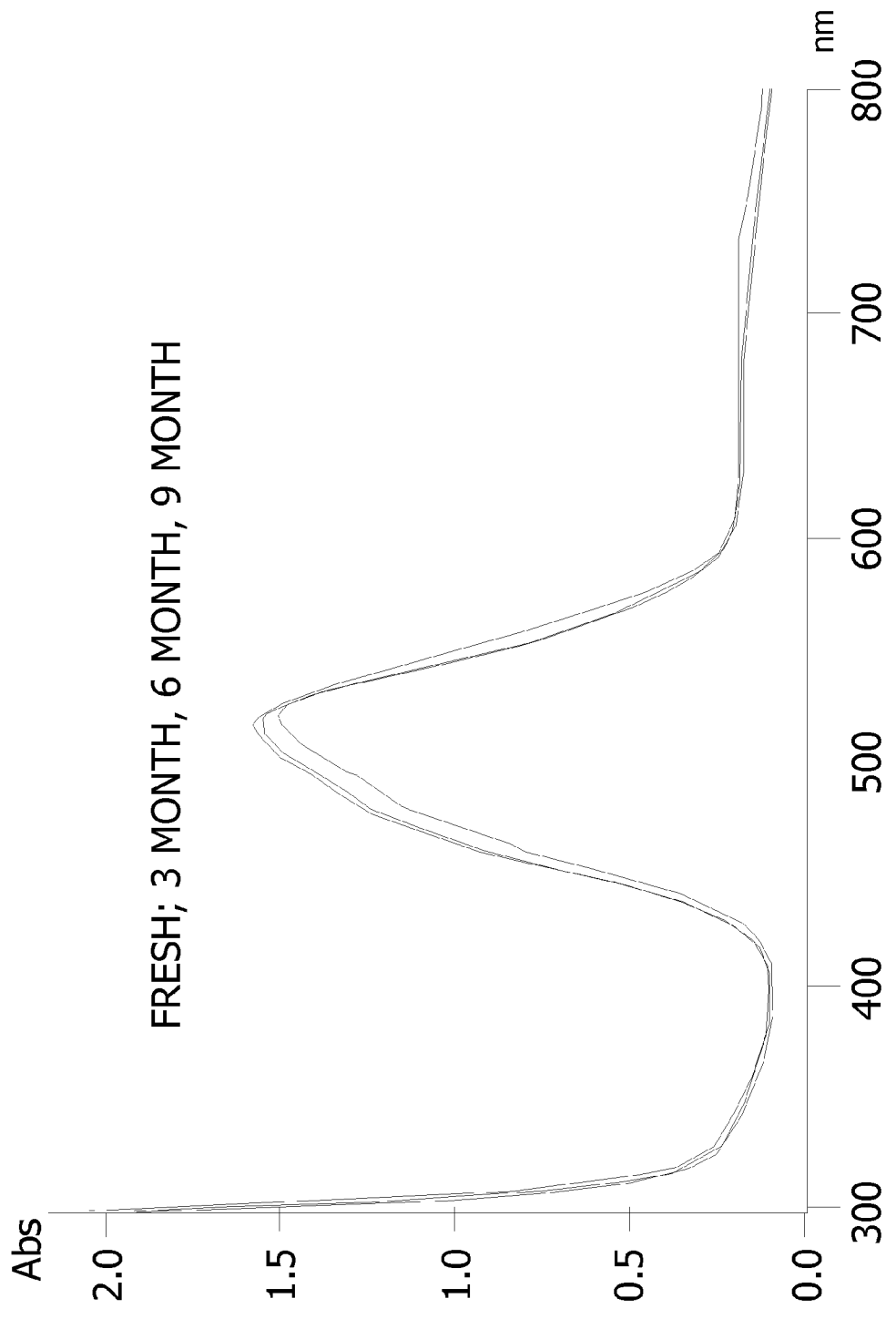
FIG. 6 is a UV-Vis spectrum indicating the control of the $Co^{3+}$ ion concentration in an electroless cobalt deposition composition. The UV-Vis spectrum was obtained according to the method of Example 7.

Inhibiting Co(II) Ion Oxidation in Electroless Cobalt Deposition Compositions With Packaging An electroless deposition composition was prepared with degassing treatment and controlled storage method and aged. UV-Vis spectroscopy was performed for samples after no aging, aging for six months, aging from nine months, and aging for eleven months. FIG. 6 displays the UV-Vis spectra showing a relatively constant concentration of Co(III) ion in the electroless deposition composition during the 11-month aging test.

In view of the above, it will be seen that the several objects of the invention are achieved and other advantageous results attained.

When introducing elements of the present invention or the preferred embodiment(s) thereof, the articles "a", "an", "the" and "said" are intended to mean that there are one or more of the elements. For example, that the foregoing description and following claims refer to "an" interconnect means that there are one or more such interconnects. The terms "comprising", "including" and "having" are intended to be inclusive and mean that there may be additional elements other than the listed elements.

As various changes could be made in the above without departing from the scope of the invention, it is intended that all matter contained in the above description and shown in the accompanying drawings shall be interpreted as illustrative and not in a limiting sense.

What is claimed is:

1. A method of preparing an aqueous electroless deposition composition for electrolessly depositing Co or a Co alloy onto a substrate in manufacture of microelectronic devices, the method comprising:
    treating water with a deoxygenating treatment to yield treated water having an oxygen concentration below 2 ppm;
    adding a source of $Co^{2+}$ ions, a B-based or P-based reducing agent, and a complexing agent to the treated water to yield an aqueous electroless Co deposition composition comprising at least about 0.5 g/L $Co^{2+}$ ions and an oxygen concentration no greater than 2 ppm; and
    incorporating an oxygen scavenger into the electroless deposition composition wherein the oxygen scavenger is selected from the group consisting of $SO_3^{2-}$, $HSO_3^{-}$, hydroquinone, catechol, resorcinol, and combinations thereof.

2. The method of claim 1 wherein said treating said water with said deoxygenating treatment comprises a treatment selected from the group consisting of gas purging, heating, applying a vacuum, sonicating, and flowing over a gas transfer membrane.

3. The method of claim 2 wherein said treating said water with said deoxygenating treatment comprises gas purging.

4. The method of claim 3 wherein said gas purging comprises purging with a gas selected from between nitrogen and argon.

5. The method of claim 2 wherein said treating said water with said deoxygenating treatment comprises heating.

6. The method of claim 5 wherein said heating comprises heating to a temperature not greater than about 85° C.

7. The method of claim 5 wherein said heating comprises heating to a temperature not greater than about 85° C. under a noble gas ambient.

8. The method of claim 2 wherein said treating said water with said deoxygenating treatment comprises applying a vacuum.

9. The method of claim 2 wherein said treating said water with said deoxygenating treatment comprises sonicating.

10. The method of claim 2 wherein said treating said water with said deoxygenating treatment comprises flowing over a gas transfer membrane.

11. The method of claim 1 wherein the oxygen scavenger comprises $SO_3^{2-}$, $HSO_3^{-}$, or a combination thereof.

12. The method of claim 11 wherein the oxygen scavenger is present in the electroless deposition composition at a concentration between about 0.01 g/L and about 1 g/L.

13. The method of claim 1 wherein the oxygen scavenger comprises hydroquinone at a concentration between about 0.01 g/L and about 0.5 g/L.

14. The method of claim 1 wherein the oxygen scavenger comprises catechol in a concentration between about 0.01 g/L and about 0.5 g/L.

15. The method of claim 1 wherein the oxygen scavenger comprises resorcinol in a concentration between about 0.01 g/L and about 0.5 g/L.

16. The method of claim 1 further comprising incorporating hydrazine as an oxygen scavenger into the electroless deposition composition in a concentration between about 0.01 g/L and about 0.5 g/L.

17. The method of claim 1 further comprising incorporating ascorbic acid as an oxygen scavenger into the electroless deposition composition.

18. The method of claim 1 wherein the treated water and the aqueous electroless Co deposition composition have an oxygen concentration no greater than about 1 ppm.

19. The method of claim 1 wherein the treated water and the aqueous electroless Co deposition composition have an oxygen concentration no greater than about 0.5 ppm.

20. The method of claim 1 wherein the water prior to said deoxygenating treatment has an oxygen concentration of at least about 7 ppm and the treated water and the aqueous electroless Co deposition composition have an oxygen concentration no greater than about 2 ppm.

21. The method of claim 1 wherein the water prior to said deoxygenating treatment has an oxygen concentration of at least about 7 ppm and the treated water and the aqueous electroless Co deposition composition have an oxygen concentration no greater than about 1 ppm.

22. The method of claim 1 wherein the water prior to said deoxygenating treatment has an oxygen concentration of at least about 7 ppm and the treated water and the aqueous electroless Co deposition composition have an oxygen concentration no greater than about 0.5 ppm.

* * * * *